United States Patent [19]

Marchisi

[11] Patent Number: 5,032,894
[45] Date of Patent: Jul. 16, 1991

[54] SEMICONDUCTOR CARD WITH ELECTRICAL CONTACTS ON BOTH FACES

[75] Inventor: Giuseppe Marchisi, Milan, Italy

[73] Assignee: SGS-ATES Componenti Elettronici S.p.A., Catania, Italy

[21] Appl. No.: 310,029

[22] Filed: Feb. 8, 1989

Related U.S. Application Data

[63] Continuation of Ser. No. 505,327, Jun. 17, 1983, abandoned.

[30] Foreign Application Priority Data

Mar. 9, 1983 [IT] Italy .................... 19963 A/83

[51] Int. Cl.$^5$ .................... H01L 23/48; H01L 23/50
[52] U.S. Cl. .................... 357/70; 357/72; 357/68
[58] Field of Search ............ 357/70, 68, 74, 80, 357/72; 174/52.4

[56] References Cited

U.S. PATENT DOCUMENTS

| | | | |
|---|---|---|---|
| 3,628,105 | 12/1971 | Sakai et al. | 357/70 |
| 3,641,401 | 2/1972 | Lynch | 357/80 |
| 3,912,852 | 10/1975 | Simon | 357/70 |
| 4,100,566 | 7/1978 | Okikawa et al. | 357/70 |
| 4,147,889 | 4/1979 | Andrews et al. | 357/70 |
| 4,459,607 | 9/1984 | Reid | 357/70 |

Primary Examiner—Rolf Hille
Assistant Examiner—S. V. Clark
Attorney, Agent, or Firm—Cushman, Darby & Cushman

[57] ABSTRACT

Two superimposed series of electric contacts in the shape of metal-sheet strips, electrically connected to a metallic plate which supports a semiconductor chip, are electrically separated but mechanically connected by an interposed layer of insulating adhesive material. The whole is completely inserted in a covering of insulating material, which forms a flat support, from which, at opposite faces, only limited ajdacent contact portions of the electric contacts emerge.

The place and at least one of the two series of contacts are part of a single starting metallic frame, on which the second series of contacts is superimposed. The latter series of contacts can be part of the same metallic frame as the first series in which case the device is formed by a folding operation. Alternatively the second series can be prepared separately and then applied on the first series.

4 Claims, 1 Drawing Sheet

SEMICONDUCTOR CARD WITH ELECTRICAL CONTACTS ON BOTH FACES

This is a continuation of application Ser. No. 06/505,327, filed Jun. 17, 1983, which was abandoned upon the filing hereof.

The present invention relates to a flat-card-shaped semiconductor device with electric contacts on both faces.

There are known and used, especially in the field of television electronic games, card-shaped semiconductor devices, where on both faces of an insulating support of glass fiber and epoxy resin there are formed by superficial metallization respective series of electric contacts connected to a semiconductor chip deposited and encapsulated on a face of the same insulating support.

Such known devices present the disadvantage of being too expensive, especially as a consequence of the high cost of the insulating support and of the laboriousness of the formation process of the electric contacts.

The object of the present invention is to provide a semiconductor device of flat-card kind with electric contacts on the two opposite faces, which is less expensive than those previously mentioned.

According to the invention such a semiconductor device comprises a flat insulating support, a semiconductor chip and two superimposed series of electric contacts, characterized in that said electric contacts are constituted by sheet-metal strips electrically connected to a metallic support plate for the semiconductor chip and said flat support comprises a layer of insulating adhesive material interposed between the two series of electric contacts and a covering package of insulating material from which, at opposite faces of said flat support, only limited adjacent contact portions of said electric contacts emerge.

From comparative tests, it has appeared that the device according to the invention, for its shape and for its manufacture way, is less expensive than known devices. This is especially due to the fact that there is no expensive preformed card, but rather there are more simple constructive elements, such as metallic frames which can be obtained by shearing, the cost of which is relatively low. In addition, the difficult process of deposition of the electric contacts on a preformed card are avoided.

Further, the device according to the invention offers greater reliability due to the fact that the whole system of contacts is included in the insulating covering, except for the contact portions.

Finally the device according to the invention offers the same cost and reliability advantages of the normal integrated circuits of the so called "dual-in-line" kind, having with respect to them the quality of the flat card conformation, in many cases useful for its reduced bulk and the ready substitution in case of necessity.

The characteristics and the advantages of the present invention will be made more evident by the following detailed description of an embodiment illustrated by way of non-limitative example in the enclosed drawings, in which.

Figure 1:
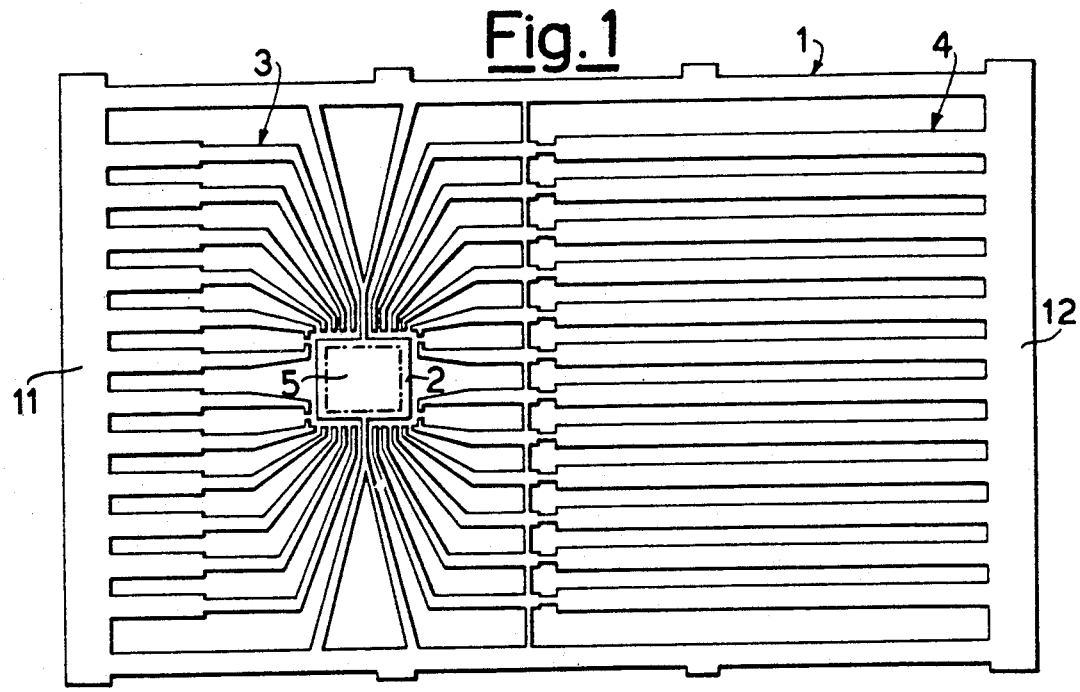
FIG. 1 shows in top plan view a metallic frame with two contact series, which frame constitutes the starting element for obtaining a semiconductor device according to the invention.

With reference to FIG. 1, there is illustrated a flat metallic frame 1, wherein there are formed by shearing a plate 2 for receiving a semiconductor chip 5 and two opposite series of electric contacts 3 and 4 formed in the shape of thin metal-sheet strips converging towards the plate 2.

Once a semiconductor chip 5 has been deposited and fixed on the plate 2 and then electrically connected to the electric contacts 3 and 4 by means of thin conducting filaments 6 and 7 (FIGS. 1 and 2), the part of the frame 1 which comprises the contacts 4 is folded under the plate 2 and under the contacts 3, with interposition of a thin layer of insulating adhesive material 8, for example an epoxy glue. There are also formed offset terminal portions 9 and 10 (which will serve as external electrical contacts in the finished device) of the contacts 3 and 4, and the ends 11 and 12 of the frame 1 are removed, in order to electrically and mechanically separate the contacts of the series 3 and 4, which are kept in position by the adhesive.

The chip 5 is encapsulated in a suitable resin 13 before or after the folding operation. After the folding operation, the folded frame is covered with epoxy resin 14, taking care to leave emerging from the so obtained container or plane "package" (in addition to the encapsulated chip) only the contact portions 9 and 10 of the electric contacts 3 and 4, distributed in two series on the opposite faces of the card (FIGS. 3 and 4).

Figure 3:
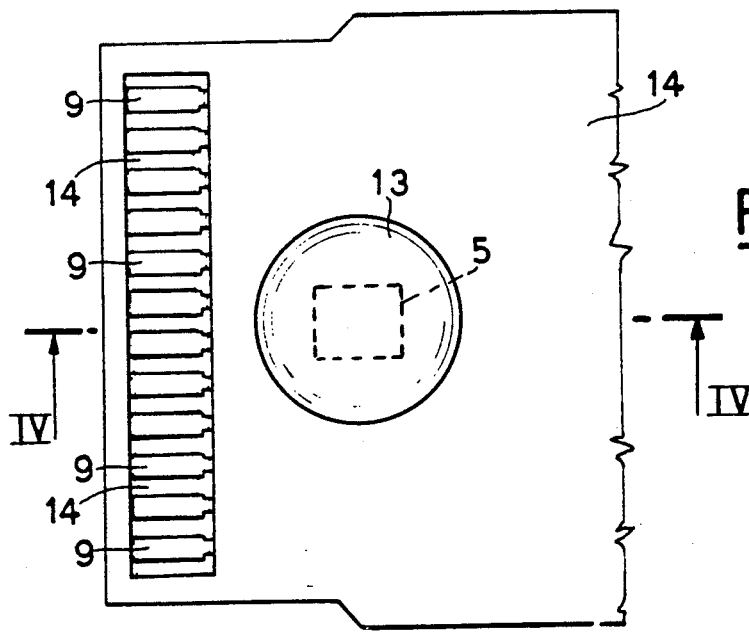
FIG. 3 shows in top plan the semiconductor device at the end of the fabrication process.
Figure 4:
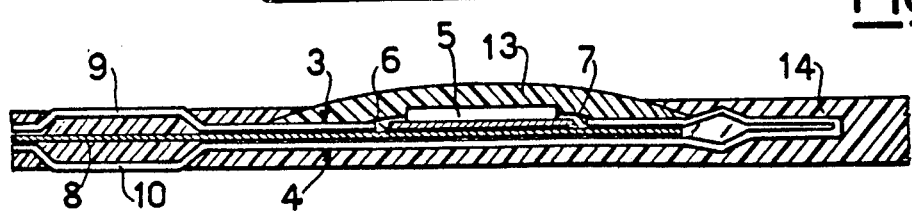
FIG. 4 shows said device in section along line IV—IV of FIG. 3.

There is thus obtained a semiconductor device in the shape of a flat card, which, as illustrated in FIGS. 3 and 4, contains an encapsulated semiconductor chip and leaves emerging from the two opposite faces of the container or "package" 14 two respective series of terminal portions 9 and 10 of electric contacts which are otherwise completely embedded in the resin.

Figure 2:
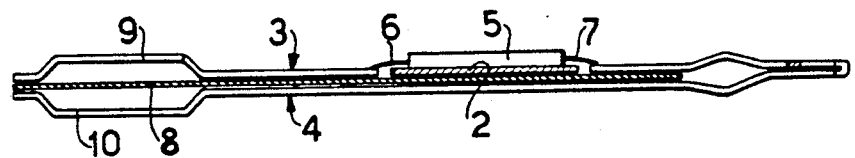
FIG. 2 shows said frame in section after it has received the semiconductor chip and after one series of contacts has been folded under the other series with interposition of a layer of insulating adhesive material.

Alternatively to the described process there can be used a metallic frame with a single series of contacts, and the second series of contacts can be applied later under the first one series so as to obtain the same configuration illustrated in FIG. 2.

We claim:

1. A flat-shape semiconductor device comprising a semiconductor chip, a metallic flat support plate for said semiconductor chip, a first plurality of electric contacts formed by metal-sheet strips which are arranged at one side of said support plate in a first plane substantially comprising said support plate and which are electrically connected to said chip by respective thin wires, a second plurality of electric contacts formed by metal-sheet strips arranged at said one side of said support plate in a second plane substantially parallel to that of said first plurality of contacts and electrically connected to said chip by respective thin wires, said planes being superimposed to one another, an insulating layer of adhesive material interposed between said first and second pluralities of electric contacts, and an insulating outer package having opposite major surfaces and formed in such a way as to allow only portions of said first and second pluralities of electric contacts to emerge from said outer package at respective ones of said opposite major surfaces of said outer package.

2. A semiconductor device as in claim 1 wherein the semiconductor chip is encapsulated in resin.

3. A semiconductor device as in claim 1 wherein the adhesive is epoxy glue.

4. A semiconductor device as in claim 1 wherein the insulating outer package is formed of epoxy resin.

* * * * *